United States Patent
Chen et al.

(10) Patent No.: US 10,062,584 B1
(45) Date of Patent: Aug. 28, 2018

(54) METHOD FOR FORMING SEMICONDUCTOR STRUCTURE

(71) Applicant: UNITED MICROELECTRONICS CORP., Hsinchu (TW)

(72) Inventors: Kuan-Lin Chen, Changhua (TW); An-Chi Liu, Tainan (TW); Kun-Yuan Liao, Hsinchu (TW); Cheng-Pu Chiu, New Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/613,395

(22) Filed: Jun. 5, 2017

(51) Int. Cl.
| | |
|---|---|
| H01L 21/336 | (2006.01) |
| H01L 21/67 | (2006.01) |
| H01L 23/525 | (2006.01) |
| H01L 23/29 | (2006.01) |
| H01L 21/02 | (2006.01) |
| H01L 21/302 | (2006.01) |

(52) U.S. Cl.
CPC .. *H01L 21/67063* (2013.01); *H01L 21/02008* (2013.01); *H01L 21/302* (2013.01); *H01L 21/67023* (2013.01); *H01L 23/29* (2013.01); *H01L 23/5256* (2013.01)

(58) Field of Classification Search
CPC .................. H01L 21/67063; H01L 21/02008
See application file for complete search history.

(56) References Cited

U.S. PATENT DOCUMENTS

| | | | |
|---|---|---|---|
| 8,524,605 | B1 | 9/2013 | Chen |
| 8,546,202 | B2 | 10/2013 | Tung et al. |
| 8,822,137 | B2* | 9/2014 | Lin ...................... H01L 23/5222 430/311 |
| 8,900,937 | B2 | 12/2014 | Lin et al. |
| 2016/0293420 | A1* | 10/2016 | Tang ................... H01L 21/0337 |
| 2016/0296120 | A1* | 10/2016 | Miyasa ................ A61B 5/0095 |
| 2017/0005181 | A1* | 1/2017 | Liou ..................... H01L 21/308 |

\* cited by examiner

*Primary Examiner* — Julio J Maldonado
*Assistant Examiner* — Andre' C Stevenson
(74) *Attorney, Agent, or Firm* — WPAT, PC

(57) ABSTRACT

A method for forming a semiconductor structure is disclosed. The method includes the following steps. A first pattern structure and a second pattern structure are formed on a substrate. The second pattern structure is wider than the first pattern structure. Spacers are formed on sidewall surfaces of the first pattern structure and the second pattern structure. An oxidizing treatment step is performed to the spacers having a width gradually increased from tops of the spacers. A pattern defined with the spacers is transferred into the substrate after the oxidizing treatment step.

19 Claims, 3 Drawing Sheets

METHOD FOR FORMING SEMICONDUCTOR STRUCTURE

BACKGROUND

Technical Field

The disclosure relates to a method for forming a semiconductor structure, and more particularly to a method for forming a patterned structure.

Description of the Related Art

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (FinFET) were thus developed.

The introduction of FinFETs has the advantageous feature of increasing drive current without the cost of occupying more chip area. However, the small size of FinFET transistors raises numerous issues during their production and manufacturing.

SUMMARY

According to an embodiment, a method for forming a semiconductor structure is provided, comprising the following steps. A first pattern structure and a second pattern structure are formed on a substrate. The second pattern structure is wider than the first pattern structure. A dielectric layer is formed. The dielectric layer is on upper surfaces and sidewall surfaces of the first pattern structure and the second pattern structure. The dielectric layer on the upper surfaces of the first pattern structure and the second pattern structure is removed. The dielectric layer on the sidewall surfaces of the first pattern structure and the second pattern structure is oxidized to form an oxidized dielectric layer after removing the dielectric layer on the upper surfaces of the first pattern structure and the second pattern structure. A pattern defined with the oxidized dielectric layer is transferred into the substrate.

According to another embodiment, a method for forming a semiconductor structure is provided, comprising the following steps. A first pattern structure and a second pattern structure are formed on a substrate. The second pattern structure is wider than the first pattern structure. Spacers are formed on sidewall surfaces of the first pattern structure and the second pattern structure. An oxidizing treatment step is performed to the spacers having a width gradually increased from tops of the spacers. A pattern defined with the spacers is transferred into the substrate after the oxidizing treatment step.

Figure 1:
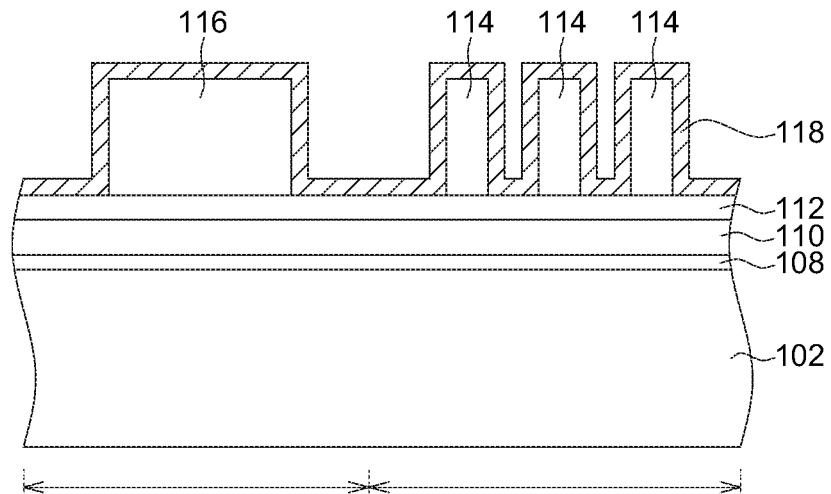
FIGS. 1-6 illustrate a method for forming a semiconductor structure according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

According to embodiments, a method for forming a semiconductor structure is disclosed. During forming a photo resist pattern, an oxidized dielectric layer of a spacer exposed to a photo resist can isolate an inner portion of the spacer without being oxidized from the photo resist, and thus can prevent the inner portion of the spacer from a poison from the photo resist.

Embodiments are provided hereinafter with reference to the accompanying drawings for describing the related procedures and configurations. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

FIGS. 1-6 illustrate a method for forming a semiconductor structure according to an embodiment.

Referring to FIG. 1, a substrate 102 is provided. The substrate 102 may comprise a silicon containing material, for example a silicon substrate, but is not limited thereto. For example, the substrate 102 may comprise a SOI substrate or a bulk silicon substrate. The substrate 102 comprises a first region 104 and a second region 106 for forming different semiconductor devices defined thereon.

A pad layer may be formed on the substrate 102. The pad layer may comprise an oxide, a nitride, or a combination thereof. For example, a pad layer 108 formed on the substrate 102 may comprise an oxide, such as silicon oxide. A pad layer 110 formed on the pad layer 108 may comprise a nitride, such as silicon nitride. A hard mask layer 112 may be formed on the pad layer 110. The hard mask layer 112 may comprise an oxide, such as silicon oxide. In other embodiments, materials such as silicon oxide, silicon nitride, low-k dielectrics such as carbon doped oxides, extremely low-k dielectrics such as porous carbon doped silicon dioxide, a polymer such as polyimide, combinations of these, or the like may be used for the pad layer 108, the pad layer 110, and the hard mask layer 112.

First pattern structures 114 and a second pattern structure 116 may be formed on the hard mask layer 112. The second pattern structure 116 is wider than the first pattern structures 114. The first pattern structures 114 and the second pattern structure 116 may comprise a silicon containing material, such as amorphous silicon, but is not limited thereto. In an embodiment, for example, the first pattern structures 114 and the second pattern structure 116 are formed simultaneously by a method comprising forming a conformal dielectric film (not shown) on the hard mask layer 112, and then patterning the conformal dielectric film.

A dielectric layer 118 may be formed to cover the hard mask layer 112, the first pattern structures 114 and the second pattern structure 116. In embodiments, the dielectric layer 118 comprises a material different from the first pattern structures 114 and the second pattern structure 116. For example, the dielectric layer 118 may comprise a nitride, such as silicon nitride.

Figure 2:
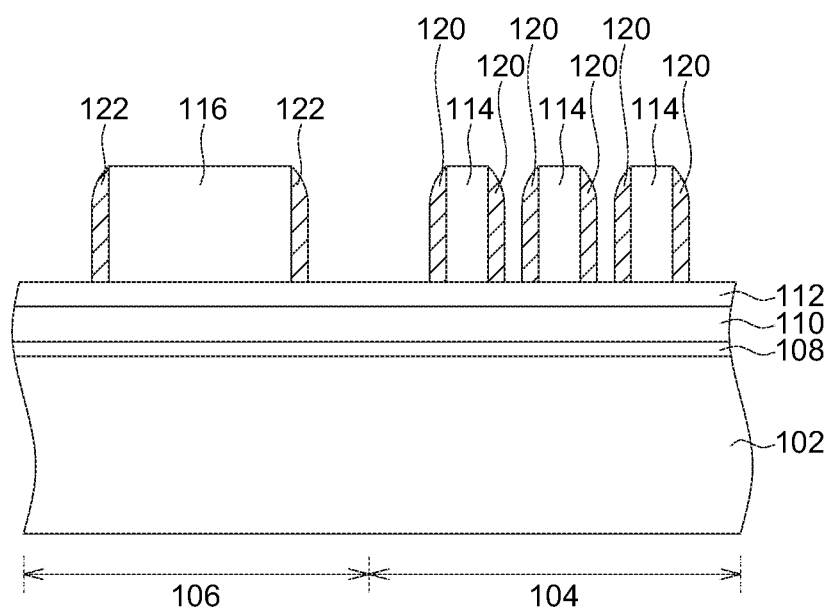

Referring to FIG. 2, the dielectric layer 118 (FIG. 1) on upper surfaces of the first pattern structures 114 and an upper surface of the second pattern structure 116 is removed so as to expose the upper surfaces of the first pattern structures 114 and the upper surface of the second pattern structure 116, while the dielectric layer 118 on sidewall surfaces of the first pattern structures 114 and sidewall surfaces of the second pattern structure 116 is remained to form spacers 120 and spacers 122.

In an embodiment, for example, an anisotropic etching step is performed to remove the dielectric layer 118 (FIG. 1) on the upper surfaces of the first pattern structures 114 and the second pattern structure 116 and on the hard mask layer 112, and also remove a portion of the dielectric layer 118 on the sidewall surfaces of the first pattern structures 114 and the second pattern structure 116 simultaneously. Each of the spacers 120 and the spacers 122 left from the anisotropic etching step have a width gradually increased form a top of which, as shown in FIG. 2. In another embodiment, an etching step may be performed to remove the dielectric layer 118 (FIG. 1) on the upper surfaces of the first pattern structures 114 and the second pattern structure 116 and on the hard mask layer 112, and remain spacers having the same thickness (not shown).

Figure 3:
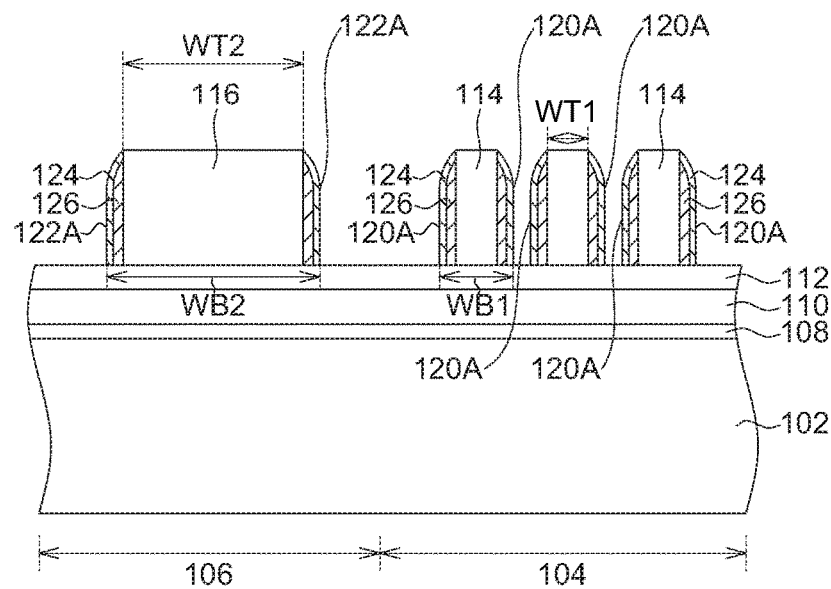

Referring to FIG. 3, the spacers 120 and the spacers 122 (FIG. 2) are oxidized to form spacers 120A and spacers 122A by an oxidizing treatment step. The oxidizing treatment step may comprise a plasma method. In an embodiment, the oxidizing treatment step is performed to oxidize outer portions of the spacers 120 and the spacers 122 (FIG. 2) so as to form an oxidized dielectric layer 124 adjoined with an inner portion 126 of each of the spacers 120A and the spacers 122A. The inner portions 126 of the spacers 120A and the spacers 122A may be without being oxidized by the oxidizing treatment step. For example, the inner portion 126 may comprise a nitride without an oxygen element. For example, the inner portion 126 may comprise silicon nitride, and the oxidized dielectric layer 124 may comprise silicon oxynitride formed by oxidizing the silicon nitride. In another embodiment, by the oxidizing treatment step, the spacers (not shown) on the first pattern structures 114 may be wholly oxidized, while the spacers (similar to spacers 122A as shown in FIG. 3) on the second pattern structure 116 have the oxidized dielectric layer 124 adjoined with the inner portion 126 without being oxidized by the oxidizing treatment step. In other embodiments, the whole of the spacers (not shown) on the first pattern structures 114 and the spacers (not shown) on the second pattern structure 116 may be oxidized through the oxidizing treatment step.

A lateral distance between opposing outer surfaces of the spacers 120A on the sidewalls surfaces of the first pattern structure 114 is smaller than a lateral distance between opposing outer surfaces of the spacers 122A on the sidewalls surfaces of the second pattern structure 116. For example, a bottom width WB1 defined by bottoms of the outer surfaces of the spacers 120A is smaller than a bottom width WB2 defined by bottoms of the outer surfaces of the spacers 122A in the same level as shown in FIG. 3. For example, a ratio of the bottom width WB2 to the bottom width WB1 may be larger than 2. Alternatively, a top width WT1 defined by tops of the outer surfaces of the spacers 120A is smaller than a top width WT2 defined by tops of the outer surfaces of the spacers 122A in the same level as shown in FIG. 3. For example, a ratio of the top width WT2 to the top width WT1 may be larger than 2.

Figure 4:
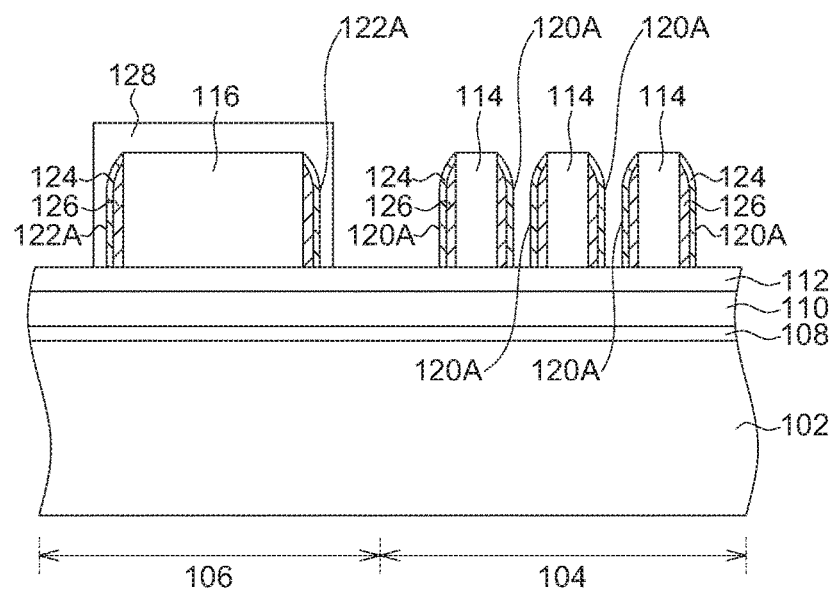

Referring to FIG. 4, a photo resist pattern 128 is formed. The photo resist pattern 128 covers the second pattern structure 116 and the spacers 122A, and exposes the first pattern structures 114 and the spacers 120A. The photo resist pattern 128 may be formed by a method comprising forming a photo resist coating film (not shown) covering the first pattern structures 114, the spacers 120A on the first pattern structures 114, the second pattern structure 116, the spacers 122A on the second pattern structure 116, and the hard mask layer 112, and then patterning the photo resist film. During the formation of the photo resist pattern 128, the oxidized dielectric layer 124 of each of the spacers 120A and the spacers 122A isolates the inner portion 126 from the photo resist coating film (or photo resist pattern 128), and thus can prevent the inner portion 126 from a poison from the photo resist coating film (or photo resist pattern 128).

Figure 5:
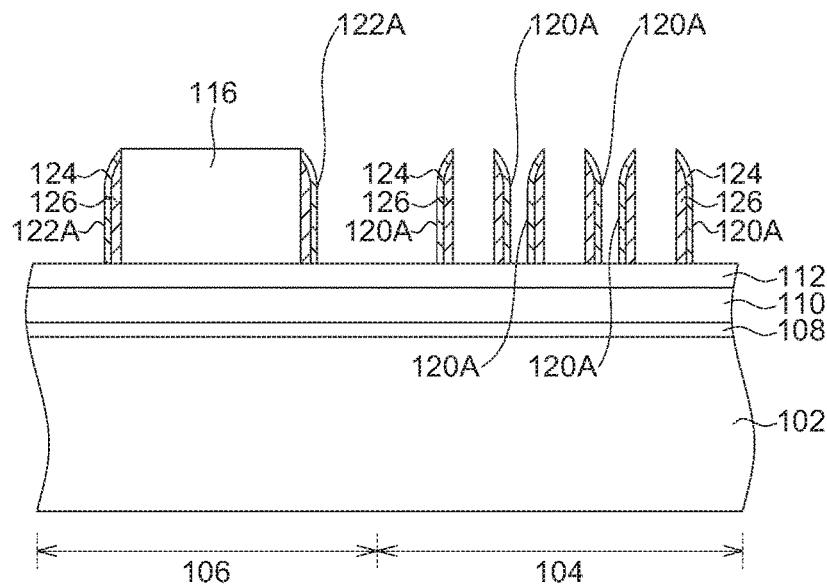

Referring to FIG. 5, the first pattern structures 114 (FIG. 4) exposed by the photo resist pattern 128 are removed by an etching step. The etching step may comprise a wet etching method, a dry etching method, etc. Next, the photo resist pattern 128 is removed.

Figure 6:
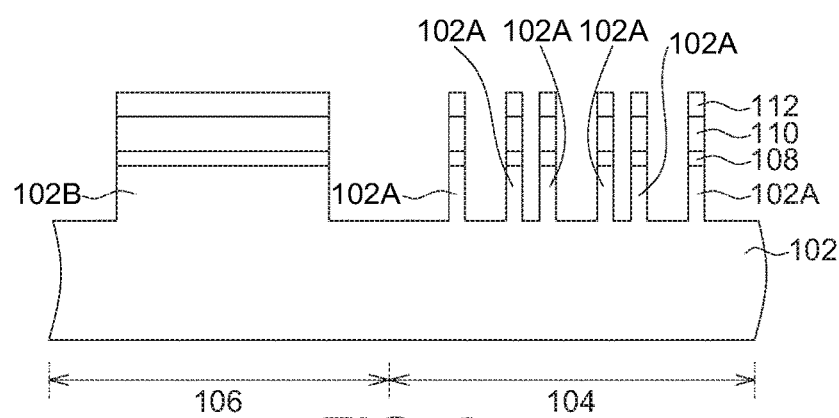

Referring to FIG. 6, after the photo resist pattern 128 (FIG. 5) is removed, a structural pattern defined by using the spacers 120A, the second pattern structure 116, and the spacers 122A on the second pattern structure 116 as shown in FIG. 5 is transferred down into the substrate 102 by an etching step so as to form first substrate portions 102A in the first region 104 and a second substrate portion 102B in the second region 106. The etching step may comprise a wet etching method, a dry etching method, etc.

In an embodiment, the structural pattern may be transferred down to the hard mask layer 112, the pad layer 110, the pad layer 108, and the substrate 102 in sequence. In an embodiment, for example, the spacers 120A, the second pattern structure 116, and the spacers 122A defining the structural pattern are removed after the structural pattern is transferred to the hard mask layer 112, and then the structural pattern is further transferred downwards to the substrate 102 by using the hard mask layer 112. In embodiment, the hard mask layer 112, the pad layer 110, and the pad layer 108 may be removed after the structural pattern is transferred to the substrate 102.

The first substrate portions 102A form fine patterns in the first region 104 while the second substrate portion 102B form a large pattern in the second region 106. The first substrate portions 102A and the second substrate portion 102B having different sizes possess different functions. For example, the first substrate portions 102A having a smaller width serve as fins for multi-gate transistor devices and the second substrate portion 102B having a larger width serves as an element required by other semiconductor device.

According to the foregoing embodiments, during the formation of the photo resist pattern, the oxidized dielectric layer of the spacer can isolate the inner portion of the spacer from the photo resist coating film (or the photo resist pattern), and thus can prevent the inner portion from a poison from the photo resist coating film (or photo resist pattern).

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor structure, comprising:
    forming a first pattern structure and a second pattern structure on a substrate, wherein the second pattern structure is wider than the first pattern structure;
    forming a dielectric layer, wherein the dielectric layer is on upper surfaces and sidewall surfaces of the first pattern structure and the second pattern structure;
    removing the dielectric layer on the upper surfaces of the first pattern structure and the second pattern structure;
    oxidizing an outer portion of the dielectric layer on the sidewall surfaces of the first pattern structure and the second pattern structure to form an oxidized dielectric layer adjoined with an inner portion of the dielectric layer comprising a nitride after the removing the dielectric layer on the upper surfaces of the first pattern structure and the second pattern structure; and
    transferring a pattern defined with the oxidized dielectric layer into the substrate.

2. The method for forming the semiconductor structure according to claim 1, wherein the dielectric layer on the upper surfaces of the first pattern structure and the second pattern structure is removed by an etching step, wherein the etching step removes the dielectric layer on the upper surfaces of the first pattern structure and the second pattern structure and a portion of the dielectric layer on the sidewall surfaces of the first pattern structure and the second pattern structure simultaneously.

3. The method for forming the semiconductor structure according to claim 2, wherein a remained portion of the dielectric layer on the sidewall surfaces of the first pattern structure and the second pattern structure left by the etching step has an increased width from a top of the remained portion of the dielectric layer.

4. The method for forming the semiconductor structure according to claim 2, wherein the oxidizing the dielectric layer is oxidizing a remained portion of the dielectric layer on the sidewall surfaces of the first pattern structure and the second pattern structure left by the etching step.

5. The method for forming the semiconductor structure according to claim 1, wherein the oxidizing the dielectric layer comprises a plasma method.

6. The method for forming the semiconductor structure according to claim 1, further comprising:
    forming a photo resist pattern covering the second pattern structure and the oxidized dielectric layer on the sidewall surfaces of the second pattern structure and exposing the first pattern structure and the oxidized dielectric layer on the sidewall surfaces of the second pattern structure.

7. The method for forming the semiconductor structure according to claim 6, further comprising removing the first pattern structure while the photo resist pattern covers the second pattern structure and the oxidized dielectric layer on the sidewall surfaces of the second pattern structure.

8. The method for forming the semiconductor structure according to claim 7, further comprising removing the photo resist pattern after the removing the first pattern structure.

9. The method for forming the semiconductor structure according to claim 1, wherein the first pattern structure and the second pattern structure are in the same level.

10. The method for forming the semiconductor structure according to claim 1, wherein the pattern transferred into the substrate is further defined with the second pattern structure.

11. The method for forming the semiconductor structure according to claim 1, wherein the first pattern structure and the second pattern structure are formed at the same time, the dielectric layer on the sidewall surfaces of the first pattern structure and the dielectric layer on the sidewall surfaces of the second pattern structure are oxidized at the same time.

12. The method for forming the semiconductor structure according to claim 1, wherein a lateral distance between opposing outer surfaces of the oxidized dielectric layer on opposing sidewalls surfaces of the first pattern structure is smaller than a lateral distance between opposing outer surfaces of the oxidized dielectric layer on opposing sidewalls surfaces of the second pattern structure.

13. The method for forming the semiconductor structure according to claim 1, further comprising removing the first pattern structure after the oxidizing the dielectric layer and before the transferring the pattern into the substrate.

14. The method for forming the semiconductor structure according to claim 1, further comprising:
    forming a pad layer on the substrate; and
    forming a hard mask layer on the pad layer, wherein the first pattern structure is on the hard mask layer.

15. The method for forming the semiconductor structure according to claim 14, wherein the substrate comprises a silicon containing material, the pad layer comprises an oxide, a nitride, or a combination thereof, the hard mask layer comprises an oxide, the first pattern structure and the second pattern structure comprise another silicon containing material.

16. A method for forming a semiconductor structure, comprising:
    forming a first pattern structure and a second pattern structure on a substrate, wherein the second pattern structure is wider than the first pattern structure;
    forming spacers on sidewall surfaces of the first pattern structure and the second pattern structure;
    an oxidizing treatment step performed to outer portions of the spacers having a width gradually increased from tops of the spacers to form oxidized dielectric layers adjoined with inner portions of the spacers comprising a nitride; and
    transferring a pattern defined with the spacers into the substrate after the oxidizing treatment step.

17. The method for forming the semiconductor structure according to claim 16, comprising:
    forming a dielectric layer on upper surfaces and the sidewall surfaces of the first pattern structure and the second pattern structure; and
    an etching step for removing the dielectric layer on the upper surfaces of the first pattern structure and the second pattern structure and for removing a portion of the dielectric layer on the sidewall surfaces of the first pattern structure and the second pattern structure to form the spacers simultaneously.

18. The method for forming the semiconductor structure according to claim 16, further comprising:
    after the oxidizing treatment step, forming a photo resist pattern to cover the second pattern structure and the spacers on the sidewall surfaces of the second pattern structure and to expose the first pattern structure and the spacers on the sidewall surfaces of the first pattern structure;
    removing the first pattern structure; and
    removing the photo resist pattern after the removing the first pattern structure.

19. The method for forming the semiconductor structure according to claim 16, wherein a lateral distance between opposing outer surfaces of the spacers on opposing sidewalls surfaces of the first pattern structure is smaller than a lateral distance between opposing outer surfaces of the spacers on opposing sidewalls surfaces of the second pattern structure.

* * * * *